United States Patent
Thomas

(10) Patent No.: US 8,552,773 B2
(45) Date of Patent: Oct. 8, 2013

(54) PHASE LOCKED LOOP

(75) Inventor: Neil Edwin Thomas, St. Albans (GB)

(73) Assignee: Aeroflex International Limited, Stevenage, Hertfordshire (GB)

( * ) Notice: Subject to any disclaimer, the term of this patent is extended or adjusted under 35 U.S.C. 154(b) by 0 days.

(21) Appl. No.: 13/510,578

(22) PCT Filed: Sep. 17, 2010

(86) PCT No.: PCT/GB2010/051558
§ 371 (c)(1),
(2), (4) Date: Aug. 23, 2012

(87) PCT Pub. No.: WO2011/061520
PCT Pub. Date: May 26, 2011

(65) Prior Publication Data
US 2012/0313677 A1    Dec. 13, 2012

(30) Foreign Application Priority Data
Nov. 20, 2009  (GB) .................................. 0920350.6

(51) Int. Cl.
*H03L 7/06*  (2006.01)
(52) U.S. Cl.
USPC .......................................... 327/156; 327/147
(58) Field of Classification Search
None
See application file for complete search history.

(56) References Cited

U.S. PATENT DOCUMENTS

| | | | |
|---|---|---|---|
| 4,860,321 A | 8/1989 | Van Der Embse | |
| 5,790,613 A | 8/1998 | Tateishi | |
| 6,256,362 B1 | 7/2001 | Goldman | |
| 6,392,457 B1 * | 5/2002 | Ransijn | 327/156 |
| 6,973,150 B1 * | 12/2005 | Thuringer | 375/371 |
| 7,173,462 B1 * | 2/2007 | Wang | 327/158 |
| 7,346,139 B2 * | 3/2008 | Henrickson | 375/355 |
| 2002/0036545 A1 | 3/2002 | Fridi et al. | |
| 2004/0135639 A1 | 7/2004 | Maneatis | |
| 2006/0238261 A1 | 10/2006 | Rhee et al. | |
| 2007/0018733 A1 | 1/2007 | Wang et al. | |
| 2008/0048788 A1 | 2/2008 | Yu | |
| 2009/0256577 A1 * | 10/2009 | Hasumi et al. | 324/555 |

OTHER PUBLICATIONS

United Kingdom Intellectual Property Office, Search Report for GB 0920350.6 dated Mar. 9, 2010, 4 pages.

* cited by examiner

*Primary Examiner* — Cassandra Cox
(74) *Attorney, Agent, or Firm* — Kilpatrick Townsend & Stockton LLP

(57) ABSTRACT

A phase locked loop (10) comprising: a tuneable oscillator (12); a mixer-based phase sensitive detector (18) to receive input signals from the tuneable oscillator (12) and a reference signal (20); a cycle slip detector (26) to receive input signals from the tuneable oscillator (12) and the reference signal (20), the cycle slip detector (26) being configured to generate an output signal when two consecutive pulses are present in one of its input signals without an intervening pulse in the other of its input signals; coarse tune signal means (32, 34) to receive the output signal generated by the cycle slip detector; and adding means (24) for adding a signal output by the coarse signal means (32, 34) to a signal output by the phase sensitive detector (18) to control the frequency of the tuneable oscillator (12).

7 Claims, 5 Drawing Sheets

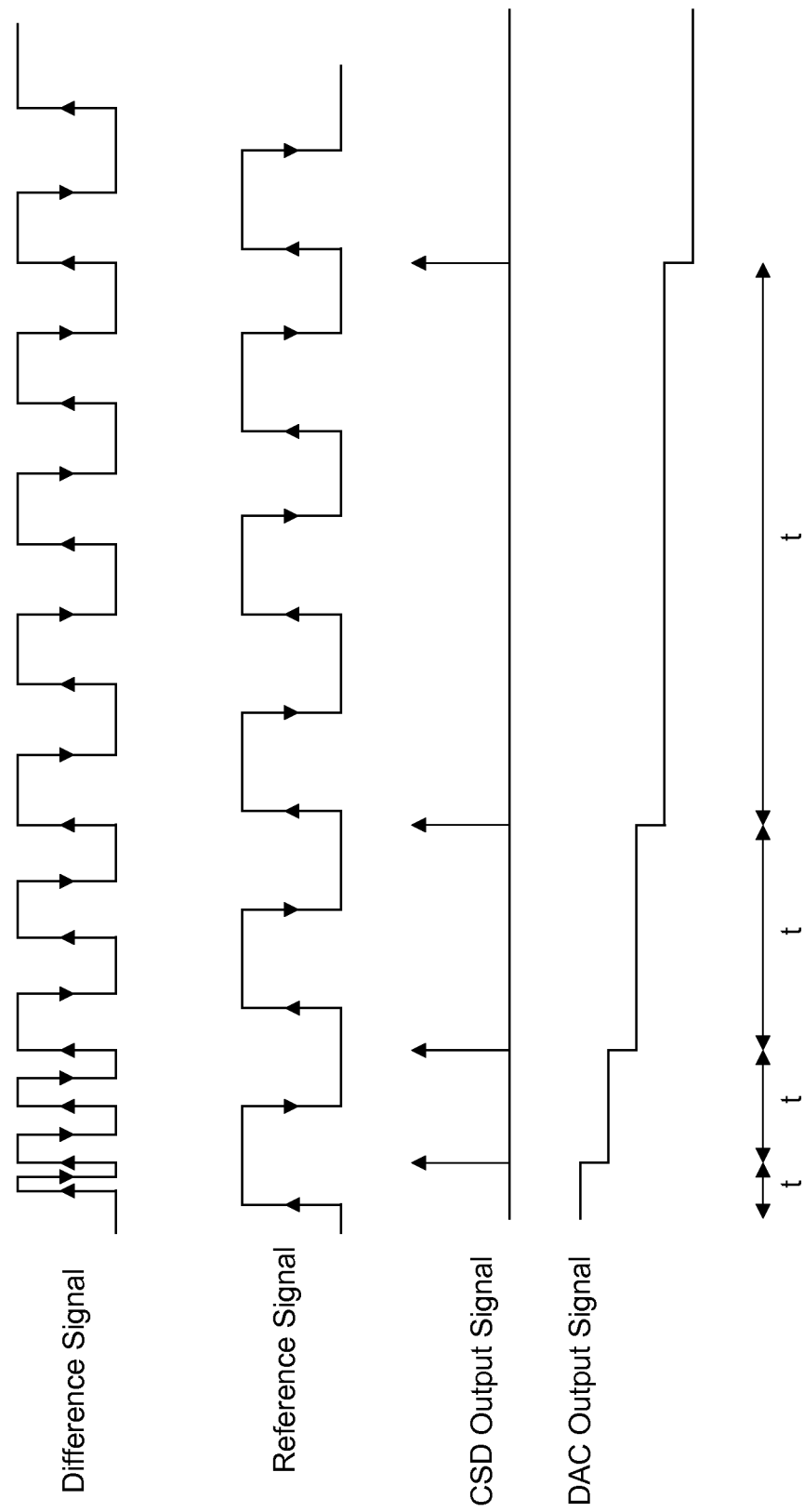

PHASE LOCKED LOOP

CROSS-REFERENCES TO RELATED APPLICATION

The present application claims priority to PCT/GB2010/051558, filed Sep. 17, 2010, which claims priority to Great Britain Patent Application No. 0920350.6, filed Nov. 20, 2009 entitled "A PHASE LOCKED LOOP" incorporated by reference for all purposes.

The present invention relates to a phase locked loop which uses a tuneable oscillator and a mixer-based phase sensitive detector.

This invention applies to a phase locked loop (PLL) which uses a tuneable oscillator (TO) and a mixer-based phase sensitive detector (PSD). As is well known in the art, it is important for a phase locked loop quickly to acquire a lock to a reference frequency (or capture) after having been pre-steered to approximately the correct frequency. A PLL with a mixer-based PSD has only a narrow capture range, which is typically a frequency range of the order of its loop bandwidth, over which it can rapidly capture.

If the pre-steer process can position the TO frequency with a frequency error less than the loop bandwidth from its target frequency, then the PLL will capture in a time of the order of the reciprocal of the loop bandwidth. If the pre-steer positions the TO with a frequency error exceeding the loop bandwidth, then the capture time may be increased by many orders of magnitude, and under some circumstances capture may not occur at all. This is in contrast to a digital phase-frequency detector which has an arbitrarily wide capture range.

The limited capture range of a PLL which employs a mixer-based PSD means that the accuracy of this pre-steer process becomes an important design consideration. As an example, for a TO with a relatively wide tuning range of 500 MHz, and a relatively small loop bandwidth of 200 kHz, the one part in 2500 tuning resolution is easily achievable with a low cost pre-steer system. However the accuracy and repeatability, especially in the face of the temperature coefficient of the TO and the long term effects of ageing, is not readily obtainable.

Thus some form of additional system is required to bring the pre-tuned TO to a frequency within the capture range. This is typically called frequency acquisition.

There are several prior art methods to address this problem.

One method is to dispense with a mixer-based PSD and use a digital phase-frequency detector instead. However, these tend to have much higher inherent noise than a mixer-type PSD, and so are not suitable for low noise synthesis applications.

Another method is to use a variable bandwidth PLL. A wider bandwidth PLL will have a wider capture range, which eases the pre-steer accuracy requirements. This suffers from the complexity of providing a variable bandwidth, and from the inevitable disturbance to the loop when the bandwidth is changed. The maximum loop bandwidth is limited by stability, and it may not be possible to increase the loop bandwidth sufficiently.

Another method is to employ a search oscillator. This applies a search waveform to swing the TO frequency up and down by at least its estimated inaccuracy, guaranteeing that it will at some time cross the target frequency. The search signal must be sufficiently slow for lock to occur as the frequency comes within capture range, despite the search waveform still being applied at that point. Once lock has been detected, the search waveform is stopped. This method can be very slow, as in the worst case nearly a whole cycle of search must be executed before finding lock. There are several ways to implement the search oscillator. One is to use a discrete oscillator which is added to the PLL signal, and disabled when lock is detected. Another is to apply positive feedback round the loop filter of the PLL such that it oscillates when not in lock. The commencement of locking introduces negative feedback into the loop which reduces the filter loop gain below the threshold needed to sustain oscillation, stopping the search oscillator automatically.

Another method is to use a digital phase-frequency detector in combination with the low noise PSD. While a digital phase-frequency detector is in its frequency detection mode, it will have accumulated some excess phase, half to one cycle depending on its order. If the phase-frequency detector is allowed to bring the loop into an initial lock, this excess phase will result in a phase overshoot which will slow the locking process down. Anticipating the correct moment at which to switch from the phase-frequency detector to the phase detector is not straightforward, based on the detector outputs available. In all cases, there will be a phase transient as a mixer-based PSD will lock with the signals in quadrature, whereas a digital phase-frequency detector will lock in phase or in anti-phase, depending on the order.

A fourth method is to use a frequency counter to measure the frequency error, and a controller to act upon the error. Any frequency counter will require a certain minimum time to achieve sufficient accuracy. If the coarse tune is being adjusted during the measurement time, the result will be inaccurate. If the coarse tune is held during the measurement time, the tuning time will be prolonged, since one or more measurements are needed. The controller can be as simple as the MSB of a pre-loaded down-counter to indicate whether the frequency is high or low, and so which way the frequency should be adjusted. As there is no indication of the size of the error, the slewing speed must be a compromise between being slow enough to lock when within capture range, but fast enough to provide a worthwhile speed improvement. The controller can be as complex as a micro-controller. This addresses the slewing speed problem at the expense of complexity.

According to the invention there is provided a phase locked loop comprising: a tuneable oscillator; a mixer-based phase sensitive detector to receive input signals from the tuneable oscillator and a reference signal; a cycle slip detector to receive input signals from the tuneable oscillator and the reference signal, the cycle slip detector being configured to generate an output signal when two consecutive pulses are present in one of its input signals without an intervening pulse in the other of its input signals; coarse tune signal means to receive the output signal generated by the cycle slip detector; and adding means for adding a signal output by the coarse signal means to a signal output by the phase sensitive detector to control the frequency of the tuneable oscillator.

The phase locked loop of the present invention permits rapid acquisition of a lock to a target frequency whilst overcoming the problems of high noise, limited loop bandwidth due to instability, slow speed and phase transients associated with prior art systems.

The phase locked loop may further comprise disabling means for selectively disabling the signal output by the phase sensitive detector.

The phase locked loop may further comprise means for enabling the signal output by the phase sensitive detector.

The enabling means may comprise a timer.

Alternatively, the enabling means may be configured to measure a time interval between adjacent output signals of the cycle slip detector.

For example, the enabling means may be configured to compare the time interval so measured to a threshold and to enable the signal output by the phase sensitive detector if the time interval betters the threshold.

The phase locked loop may further comprise a frequency translation stage for translating the frequency of the signal output by the tuneable oscillator to a different frequency.

The cycle slip detector may be configured to generate a first output signal indicating that the frequency of the signal output by the tuneable oscillator should be increased when the two consecutive pulses are present in the reference signal and may be configured to generate a second output signal indicating that the frequency of the signal output by the tuneable oscillator should be decreased when the two consecutive pulses are present in the tuneable oscillator signal.

The coarse tune signal means may be configured to increment its output signal when it receives the first output signal from the cycle slip detector as an input and may be configured to decrease its output signal when it receives the second output signal from the cycle slip detector as its input signal.

The coarse tune signal means may comprise a register and a digital to analogue converter.

The output step of the digital to analogue converter may be selected so as to bring about a change in the frequency of the output signal of the tuneable oscillator of approximately 50% of the loop bandwidth.

Embodiments of the invention will now be described, strictly by way of example only, with reference to the accompanying drawings, of which FIG. 1 is a schematic representation of a phase locked loop;

FIG. 2 is a diagram illustrating a difference signal produced by a frequency translation stage of the phase locked loop illustrated in FIG. 1, a reference signal used by the phase locked loop illustrated in FIG. 1, a signal produced by a cycle slip detector of the phase locked loop illustrated in FIG. 1, and a signal output by a digital to analogue converter forming part of a coarse tune signal means used in the phase locked loop illustrated in FIG. 1;

FIG. 5 is a diagram illustrating a signal produced by the cycle slip detector which can be used to determine when a loop filter of the phase locked loop illustrated in FIG. 4 should be enabled after having been disabled.

Figure 1:
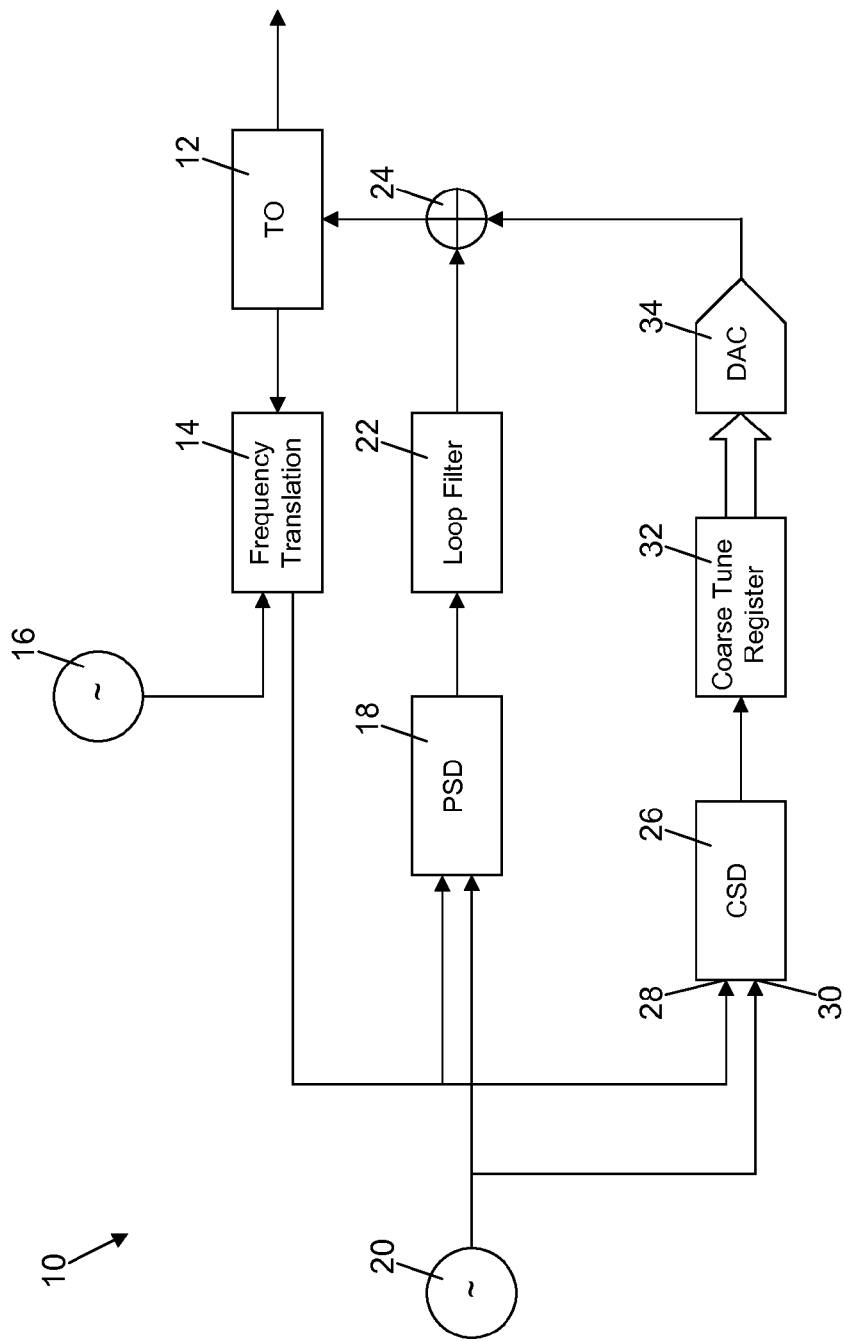

Referring first to FIG. 1, a phase locked loop is shown generally at 10, and comprises a tuneable oscillator (TO) 12, which may be, for example, a voltage controlled oscillator (VCO), a YIG tuned oscillator (YTO) or any other oscillator whose output frequency is tuneable. The TO 12 has an output which is connected to an input of a frequency translation stage 14, which is operative to downconvert the frequency of the signal output by the TO by mixing it with a signal generated by a low noise local oscillator 16, which low-noise is input to the frequency translation stage 14. Typically the TO 12 produces an output signal with a frequency of around 1 GHz, whilst the difference frequency signal output by the frequency translation stage 14 is typically in the range 10 MHz to 100 MHz. In some embodiments of the phase locked loop 10, however, the frequency translation stage 14 may be omitted such that the output signal of the TO 12 is used directly, without any frequency translation.

The difference frequency signal output by the frequency translation stage 14 is input to a first input of a mixer-based phase detector 18, which has a second input which receives a low noise frequency reference signal 20. The mixer-based phase detector 18 is operative to compare the signals at its first and second inputs to produce a phase difference signal, which is output by the mixer-based phase detector 18 to a loop filter 22. The loop filter 22 filters this phase difference signal to produce a fine-tune control signal at its output.

The output of the loop filter 22 is connected to a first input of an adder 24, which has a second input which is connected to the output of digital to analogue converter which provides a coarse tune control signal based on the output of a coarse tune signal stage, whose operation is described in detail below.

The phase locked loop 10 includes a cycle slip detector (CSD) 26, which has a first input 28 which receives the difference frequency signal output by the frequency translation stage 14, and a second input 30 which receives the low noise reference signal 20. The CSD 26 is a logic circuit which is operative to generate at its output a cycle slip signal pulse each time two consecutive pulses are received at one of its inputs 28, 30 without an intervening pulse at the other of its inputs 30, 28. For example, the CSD 26 outputs a "down" pulse if two pulses are received at its first input 28 before a pulse is received at its second input 30, which indicates that the difference signal frequency at the first input 28 is higher than the reference signal frequency at the second input 30. Conversely, the CSD 26 outputs an "up", pulse if two consecutive pulses are received at its second input 30 before a pulse is received at its first input 28, which indicates that the difference signal frequency at the first input is lower than the reference signal frequency at the second input 30. If the CSD 26 receives two consecutive pulses at one of its inputs 28, 30 with an intervening pulse at the other of its inputs 30, 28, the CSD 26 produces no output signal. For example, if the CSD 26 receives a pulse at its first input 28 followed by a pulse at its second input 30 followed by a further pulse at its first input 28 the CSD 26 produces no output.

The output of the CSD 26 is connected to an input of a coarse tune signal register 32, which has a plurality of parallel outputs, enabling it to output a digital representation of a numerical value stored in the coarse tune register 32. Each time the coarse tune register 32 receives a "down" pulse at its input (indicating that the difference signal frequency is higher than the reference signal frequency), the value stored in the coarse tune register 32 is decremented, and thus its output is also decremented, whilst when the coarse tune register 32 receives an "up" pulse (indicating that the difference signal frequency is lower than the reference signal frequency) the value stored in the coarse tune register 32 is incremented, causing its output to be incremented. Thus, the pulses produced by the CSD 26 can be regarded as control signals for the coarse tune register 32. It is to be understood that the "down" and "up" pulses produced by the CSD are not necessarily positive- or negative-going pulses in the sense of pulses going from a high voltage to a low voltage, or vice versa, but that the "down" and "up" pulses are simply command pulses which indicate to the coarse tune register 32 whether the difference signal frequency is higher or lower than the reference signal frequency, and thus whether the numerical value stored in the coarse tune register 32 should be decremented or incremented.

The outputs of the coarse tune register 32 are connected to inputs of a digital to analogue converter (DAC) 34, which converts the digital output of the coarse tune register 32 to an analogue output voltage which can take one of a plurality of values. This output voltage is a coarse tune control signal. An output of the DAC 34 is connected to the second input of the adder 24 to provide the coarse tune control signal to the adder 24.

The adder 24 adds the fine tune control signal produced by the loop filter 22 to the coarse tune control signal produced by the DAC 34 to generate a sum signal at the output of the adder 24. The output of the adder 24 is connected to a control input of the TO 12, such that the sum signal output by the adder 24 controls the frequency of the signal output by the TO 12.

Figure 2:
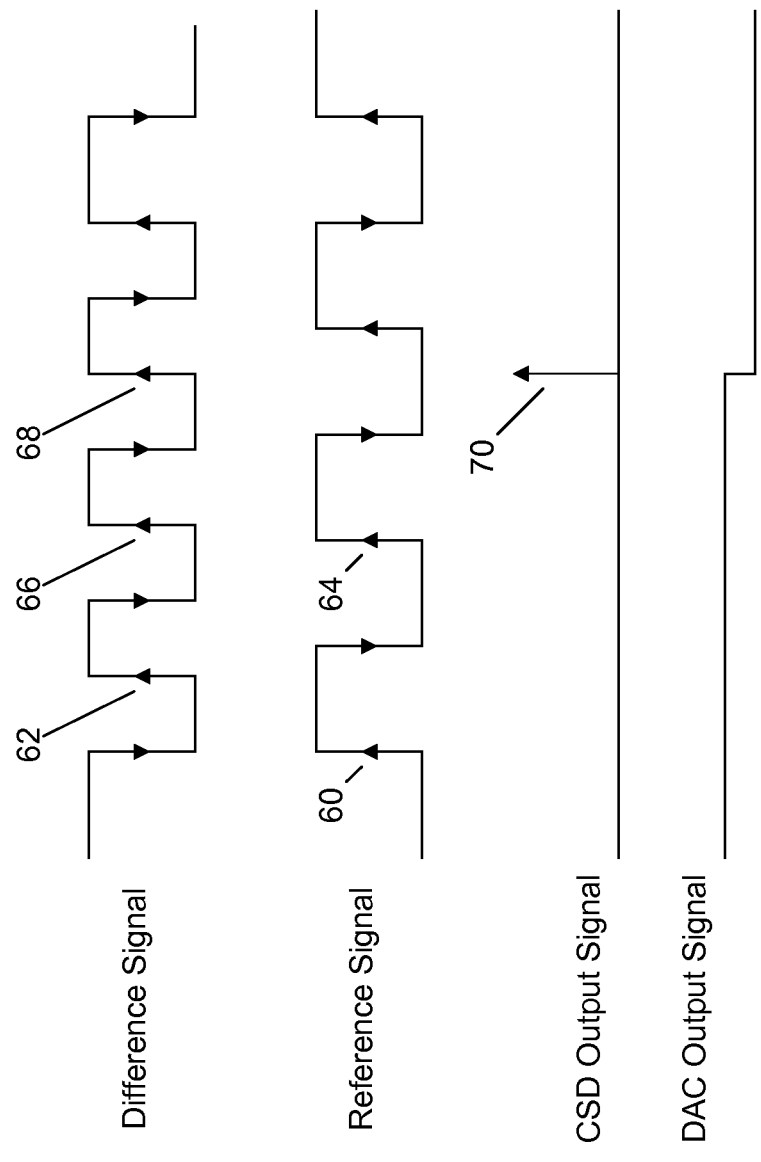

The operation of the CSD 26 is illustrated in FIG. 2. The upper trace of FIG. 2 shows the difference frequency signal at the first input 28 of the CSD 26, whilst the second trace shows the reference frequency signal at the second input 30 of the CSD 26. The third trace shows the cycle slip signal output of the CSD 26, whilst the fourth trace shows the voltage output by the DAC 34.

In the example shown in FIG. 2, the difference frequency signal at the first input 28 of the CSD 26 has a higher frequency than the reference signal at the second input 30 of the CSD 26. A first positive-going pulse 60 of the reference signal is detected at the second input 30 of the CSD 26. The next positive-going pulse detected by the CSD 26 is a positive-going pulse 62 of the difference signal at the first input 28 of the CSD 26. The next positive-going pulse to arrive at the CSD 26 is a positive-going pulse 64 of the reference signal. Thus, as the pulse 62 of the difference signal at the first input 28 intervened between the pulses 60, 64 of the reference signal at the second input 30 of the CSD 26, the CSD 26 produces no output signal for these three pulses.

The next positive-going pulse to be detected by the CSD 26 is a positive-going pulse 66 of the difference signal at the first input 28 of the CSD 26. The next positive-going pulse to arrive at the CSD 26 is a further positive-going pulse 68 of the difference signal at the first input 28 of the CSD 26. Thus, in this example, two positive-going pulses 66, 68 have been detected at the first input 28 of the CSD 26 without an intervening positive-going pulse being detected at the second input 30 of the CSD 26. At the point in time at which the pulse 66 is detected at the first input 28 of the CSD 26, or very soon after, the CSD 26 generates a "down" pulse, which is received by the coarse tune register 32, causing it to decrement. The output of the DAC 34 thus also decrements, causing the sum signal output by the adder 24 to decrement, which in turn brings about a reduction in the frequency of the signal output by the TO 12.

This process of adjustment of the coarse tune control signal output by the DAC 34 continues until the frequency of the output signal of the TO 12 is within the capture range of the phase locked loop. When this condition has been reached normal phase locked loop action occurs in the PSD 18 and the loop filter 22 to bring the output frequency of the TO 12 rapidly into lock with the target frequency. When the phase locked loop 10 is in lock the difference signal and the reference signal are identical in frequency and their phases are in quadrature.

Figure 3:
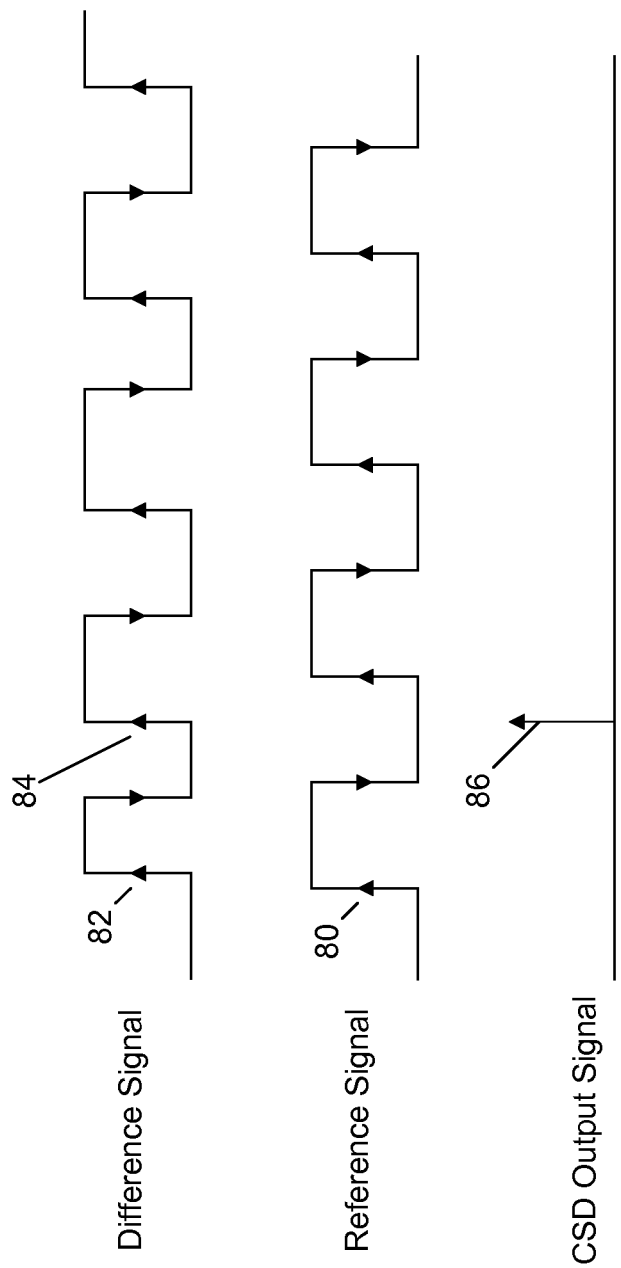
FIG. 3 is a diagram illustrating a signal produced by the cycle slip detector based on input signals received from the frequency translation stage and the reference signal showing a situation in which phase lock has been achieved.

An example of this locking action is illustrated in FIG. 3, which shows on the upper trace the difference frequency signal at the first input 28 of the CSD 26, and on the middle trace the reference frequency signal at the second input 30 of the CSD 26. The lowermost trace shows the output of the CSD 26. In the example shown in the traces of FIG. 3 the first positive-going pulse received by the CSD 26 is a pulse 80 of the reference frequency signal at the second input 30 of the CSD 26. The next two positive-going pulses received by the CSD 26 are pulses 82 and 84, which are both from the difference frequency signal at the first input 28 of the CSD 26. The CSD outputs a "down" pulse 86 on receiving the second consecutive pulse 84 at the first input 28, which causes the coarse tune register 32, and hence the output of the DAC 34 to decrement, leading to a reduction in the frequency of the signal output by the TO 12. In this example it is assumed that this reduction in frequency caused the TO 12 to come within the capture range, and phase lock followed quickly afterwards. As a mixer-based PLL locks with the signals in quadrature, there are no further cycle slip events after lock has been achieved.

A further advantage of the phase locked loop 10 over prior art systems is that there is no need to determine when lock has been acquired to decide when to disable the components governing the adjustment of the coarse tune control signal. As soon as lock is achieved, the CSD 26 stops producing any output, and thus the coarse tune register 32 is neither incremented nor decrement. As a result, the coarse tune control signal output by the DAC 34 remains constant, such that there is no coarse adjustment to the frequency of the signal output by the TO 12.

The step size of the DAC 34, that is to say the output voltage increments which cause a corresponding increment, or step, in the frequency of the signal output by the TO 12, must be chosen carefully. If the frequency step size is too large, e.g. several times the loop bandwidth, it is possible that the frequency could "hunt" either side of the frequency required to achieve lock, alternating between being too high and too high without ever locking. If the step size is too small the phase locked loop will take an excessive amount of time to achieve lock. Typically the step size may be selected as being 50% of the loop bandwidth of the phase locked loop 10.

For example, if the loop bandwidth of the phase locked loop 10 is 200 kHZ, a 100 kHz step size may be selected. In the event of an initial frequency error (or difference) of 1 MHz between the reference frequency and the output frequency of the TO 12, cycle slip pulses are initially produced one million times per second by the CSD 26. With a frequency step size of 100 kHz, it would take ten steps, or 10 µs at one million steps per second, to eliminate the error and bring the phase locked loop 10 into lock. However, as the TO 12 tunes towards the reference frequency the error frequency reduces, so the rate at which the CSD 26 produces cycle slip pulses reduces. The rate of frequency error reduction thus reduces in exponential fashion with a time constant equal to the time it would take to eliminate the error if the initial error reduction rate were maintained. In this example, the initial error would be eliminated in 10 µs at the initial error reduction rate. This time constant is the reciprocal of the frequency step size. Given an initial frequency error (or difference) the error will reduce by a factor of e for each initial time constant. Thus, correction to an error of 200 kHz from an initial 1 MHz error will take around 16 µs, which equals $$10 \text{ µs} \times \ln\left(\frac{1 \text{ MHz}}{200 \text{ kHz}}\right)$$

Similarly, correction from an initial error of 2.7 MHz to an error of 200 kHz will take around 26 µs and correction from an initial error of 7.5 MHz to an error of 200 kHz will take around 36 µs.

It will be appreciated that because of the action of the CSD 26 the phase locked loop 10 automatically adjusts the frequency slew rate of the output signal of the TO 12, thereby avoiding the problems of overshooting the target frequency due to slewing too quickly, and slow acquisition of lock due to a low frequency slew rate associated with prior art systems.

For large frequency errors the frequency slew rate is high, but as the frequency error reduces, so too does the frequency slew rate, such that the target frequency can be achieved quickly and without any overshoot. This is achieved automatically by the phase locked loop 10, without a counter or controller.

In the phase locked loop 10 illustrated in FIG. 1, the PSD 18 and the loop filter 22 remain operative throughout the acquisition process. When the phase locked loop is far from lock the high difference frequency at the input to the loop filter 22 is filtered to an insignificant amplitude. Therefore the action of the PSD 18 and the loop filter 22 does not interfere with the acquisition process. As the frequency difference between the output frequency of the TO 12 and the target frequency falls within the capture range the fine tune control signal output by the loop filter 22 pulls the TO 12 into lock. In these circumstances the phase locked loop will typically lock the TO 12 at the extreme of the range of the loop filter 22. The fine tune control is making an unnecessarily large contribution to the total tuning signal, whilst the coarse tune control signal is a few steps away from the ideal value. This method of operation offers the advantage that the phase locked loop 10 acquires lock in the shortest possible time, which may be referred to as a fast mode of operation. A disadvantage, however, is that there is a significant offset in the output of the loop filter 22, which reduces its scope to compensate for any subsequent changes in the tuning (output frequency) of the TO 12 due to temperature changes or small changes in the frequency of the reference signal, for example.

Figure 4:
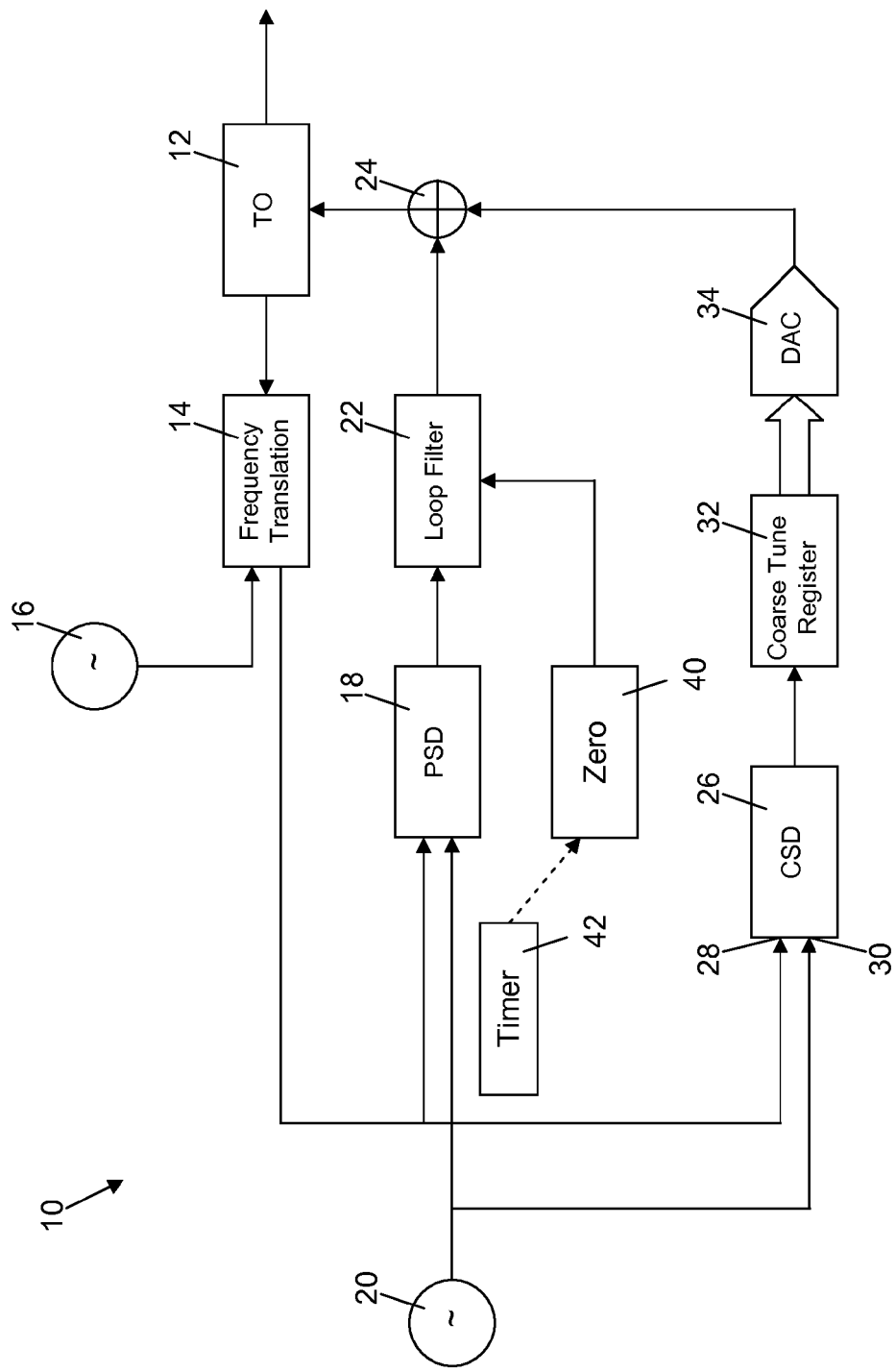
FIG. 4 is a schematic representation of an alternative embodiment of a phase locked loop.

FIG. 4 is a schematic representation of an alternative embodiment of a phase locked loop in which this disadvantage is addressed. The embodiment illustrated in FIG. 4 shares many features with the embodiment illustrated in FIG. 1, and thus the same reference numerals are used in FIG. 4 to identify features common to the embodiments illustrated in FIG. 4 and FIG. 1.

The embodiment illustrated in FIG. 4 includes means 40, such as an electrically operable switch which connects the output of the PSD 18 or/and the output of the loop filter 22 to ground, to disable or "zero" the output of the loop filter 22 or the PSD 18 until a point in the acquisition process at which the coarse tune control signal is closer to the ideal than is the case in the embodiment illustrated in FIG. 1, at which point the disabling means 40 can be disengaged or released, thereby re-enabling the output of the loop filter 22 or the PSD 18. Disabling or "zeroing" the output of the PSD 18 or/and the loop filter 22 in this way prevents these components from making any contribution to the acquisition process until the disabling means 40 is disengaged or released. When the loop filter 22 or/and the CSD 18 are released or re-enabled by deactivating the disabling means 40 lock occurs rapidly. This method of operation offers the advantage that, as the coarse tune control signal is much closer to the ideal or optimum value, the fine tune control signal need not have such a high value, as a much smaller value will be required to acquire lock. This allows more headroom to be available in the fine tune control signal output by the loop filter 22 to compensate for subsequent changes to the output frequency of the TO 12, at the expense of increased time to acquire lock. This mode of operation may be referred to as a safe mode of operation, since there is less risk of the phase locked loop 10 falling out of lock as a result of small changes in the output frequency of the TO 12.

In a phase locked loop 10 as illustrated in FIG. 4, the mode of operation can be selected between fast mode, which may be useful in circumstances where a lock is required only for a short time, but must be achieved very quickly, and safe mode, which may be appropriate in circumstances where lock speed is less important than maintaining lock for a prolonged period. This mode selection can be achieved simply by omitting to engage the disabling means 40 when fast mode is required, and engaging the disabling means 40 when safe mode is required.

It will be appreciated that selecting the correct time at which to release the disabling means 40 is important. One method involves the use of a simple timer, shown at 42 in FIG. 2. The time at which the disabling means 40 should be released is calculated from known and estimated worst case parameters. The time constant of the frequency acquisition circuit is known, as is the capture range of the PSD 18 and loop filter 22. The worst case initial frequency error can be estimated from the pre-steer system accuracy parameters. The delay time before the disabling means 40 should be released can then be calculated as $$\text{time\_constant} \times \ln\left(\frac{\text{initial\_error}}{\text{capture\_range}}\right)$$

This delay time can be programmed into the timer 42 such that the disabling means 40 is released after the delay time so calculated has elapsed.

This method has the disadvantage that waiting for correction of the worst case tuning error takes longer than the fast mode. However, an advantage arises from this, which is that the lock time is very predictable when retuning of the TO 12 is required, and this consistency may be advantageous in some situations. Additionally, the timer 42 which controls the disabling means 40 is very simple.

An alternative method uses the time interval t between pulses produced by the CSD 26 to determine the correct time point at which to release the disabling means. As is discussed above, as the phase locked loop 10 approaches lock, the time interval between successive pulses at the output of the CSD 26 increases. This is illustrated in FIG. 5, which shows the difference signal on the upper trace, the reference signal on the second trace, a series of CSD output pulses on the third trace and on the lower trace the corresponding DAC output signal. The time interval t can be used as an indication of the error between the target frequency and the output frequency of the TO 12; the longer the interval the smaller the error and vice versa. By using this interval to determine when to deactivate the disabling means 40 complete control over the compromise between lock speed and locking accuracy can be exercised. An example of how the time interval between adjacent CSD output pulses may be used to control the release of the disabling means 40 is to compare the time interval to a threshold. If the time interval exceeds the threshold, indicating that the error between the reference signal frequency and the frequency of the output signal of the TO 12 has fallen below a predetermined value, the disabling means 40 is released, allowing the PSD 18 and loop filter 22 to act to bring the phase locked loop 10 rapidly into lock.

As is discussed above, in some embodiments the frequency translation stage 14 may be omitted from the phase locked loop 10. In these circumstances the tuneable oscillator 12 tracks the reference frequency 20 exactly, rather than a difference frequency as in the embodiments described above.

Although the TO 12 in has been described above and illustrated in FIGS. 1 and 4 as having a single control input it will be appreciated that tuneable oscillators having more than one control input, such as YIG tuned oscillators (YTOs) can be used in the phase locked loop of the present invention. In these circumstances the function of the adder 24 may be provided by TO. For example, in the case of a YTO the coarse tune control signal output by the DAC 34 may be applied to the main coil, and the fine tune control signal output by the loop filter 22 may be applied to the FM coil.

Numerous methods are available for tuning the TO 12 to approximately the correct frequency prior to initiating phase lock (pre-steering the TO 12). For a TO 12 having a single control input the coarse tune register 32 may be preloaded with an appropriate initial value. Alternatively, an initial tune value could be added to the value in the coarse tune register 32, with the sum of the initial tune value and the value in the coarse tune register 32 being output to the DAC 34. A further alternative is to input an initial tuning voltage from another source into the adder 24.

Where the TO 12 has more than one control input, the methods described above can be implemented. Additionally or alternatively an initial tune value may be applied to another of the control inputs of the TO 12.

The invention claimed is:

1. A phase locked loop comprising:
   a tuneable oscillator;
   a mixer-based phase sensitive detector to receive input signals from the tuneable oscillator and a reference signal;
   a cycle slip detector to receive input signals from the tuneable oscillator and the reference signal, the cycle slip detector being configured to generate an output signal when two consecutive pulses are present in one of its input signals without an intervening pulse in the other of its input signals;
   coarse tune signal means to receive the output signal generated by the cycle slip detector;
   adding means for adding a signal output by the coarse tune signal means to a signal output by the phase sensitive detector to control the frequency of the tuneable oscillator;
   disabling means for selectively disabling the signal output by the phase sensitive detector; and
   enabling means comprising a timer for enabling the signal output by the phase sensitive detector.

2. A phase locked loop according to claim 1 wherein the enabling means is configured to measure a time interval between adjacent output signals of the cycle slip detector.

3. A phase locked loop according to claim 2 wherein the enabling means is configured to compare the time interval so measured to a threshold and to enable the signal output by the phase sensitive detector when the time interval betters the threshold.

4. A phase locked loop according to claim 1 further comprising a frequency translation stage for translating the frequency of the signal output by the tuneable oscillator to a different frequency.

5. A phase locked loop according to claim 1 wherein the cycle slip detector is configured to generate a first output signal indicating that the frequency of the signal output by the tuneable oscillator should be increased when the two consecutive pulses are present in the reference signal and is configured to generate a second output signal indicating that the frequency of the signal output by the tuneable oscillator should be decreased when the two consecutive pulses are present in the tuneable oscillator signal.

6. A phase locked loop according to claim 5 wherein the coarse tune signal means is configured to increment its output signal when it receives the first output signal from the cycle slip detector as an input and is configured to decrease its output signal when it receives the second output signal from the cycle slip detector as its input signal.

7. A phase locked loop comprising:
   a tuneable oscillator;
   a mixer-based phase sensitive detector to receive input signals from the tuneable oscillator and a reference signal;
   a cycle slip detector to receive input signals from the tuneable oscillator and the reference signal, the cycle slip detector being configured to generate an output signal when two consecutive pulses are present in one of its input signals without an intervening pulse in the other of its input signals;
   coarse tune signal means to receive the output signal generated by the cycle slip detector, wherein the coarse tune signal means comprises a register and a digital to analogue converter, and wherein an output step of the digital to analogue converter is selected so as to bring about a change in the frequency of the output signal of the tuneable oscillator of approximately 50% of the loop bandwidth; and
   adding means for adding a signal output by the coarse tune signal means to a signal output by the phase sensitive detector to control the frequency of the tuneable oscillator.

* * * * *